(12) United States Patent
Choi et al.

(10) Patent No.: US 12,138,670 B2
(45) Date of Patent: Nov. 12, 2024

(54) SUBSTRATE TREATING APPARATUS AND SUBSTRATE TREATING METHOD

(71) Applicant: SEMES CO., LTD., Cheonan-si (KR)

(72) Inventors: Junyoung Choi, Cheongju-si (KR); Jong Doo Lee, Gyeongju-si (KR)

(73) Assignee: SEMES CO., LTD., Cheonan-si (KR)

( * ) Notice: Subject to any disclaimer, the term of this patent is extended or adjusted under 35 U.S.C. 154(b) by 682 days.

(21) Appl. No.: 17/369,892

(22) Filed: Jul. 7, 2021

(65) Prior Publication Data
US 2022/0008964 A1 Jan. 13, 2022

(30) Foreign Application Priority Data
Jul. 8, 2020 (KR) .................. 10-2020-0084279

(51) Int. Cl.
*B08B 7/00* (2006.01)
*B01D 11/02* (2006.01)
(Continued)

(52) U.S. Cl.
CPC ........ *B08B 7/0021* (2013.01); *B01D 11/0203* (2013.01); *B08B 9/0321* (2013.01);
(Continued)

(58) Field of Classification Search
CPC . B08B 7/0021; B08B 9/0321; B01D 11/0203; C23G 5/04; F26B 3/02;
(Continued)

(56) References Cited

U.S. PATENT DOCUMENTS 8,793,898 B2 * 8/2014 Jeong ................ H01L 21/67051
134/32
2012/0048304 A1 * 3/2012 Kitajima ........... H01L 21/67034
134/30
(Continued)

FOREIGN PATENT DOCUMENTS

JP 2013251547 12/2013
JP 2016048775 4/2016
(Continued)

OTHER PUBLICATIONS

Office Action from the Japan Patent Office dated Aug. 9, 2022.

*Primary Examiner* — David G Cormier
*Assistant Examiner* — Thomas Bucci

(57) ABSTRACT

The inventive concept provides a substrate treating apparatus. The substrate treating apparatus includes a process chamber that provides a treatment space, in which a substrate is treated, in an interior thereof, a fluid supply unit that supplies a fluid into the process chamber, and an exhaust units including an exhaust line, through which the fluid in the process chamber is exhausted, the fluid supply unit includes a supply tank, in which the fluid is stored, a supply line connecting the supply tank and the process chamber, a branch line branched from the supply line at a first point of the supply line, and a controller that controls the fluid supply unit, and the controller controls the fluid supply unit such that the fluid is drained from the supply line through the branch line shortly before the fluid is supplied into the process chamber.

12 Claims, 11 Drawing Sheets

(51) Int. Cl.
*B08B 9/032* (2006.01)
*C23G 5/04* (2006.01)
*F26B 3/02* (2006.01)
*H01L 21/02* (2006.01)
*H01L 21/67* (2006.01)

(52) U.S. Cl.
CPC .................. *C23G 5/04* (2013.01); *F26B 3/02* (2013.01); *H01L 21/02101* (2013.01); *H01L 21/67017* (2013.01)

(58) Field of Classification Search
CPC ............... F26B 5/005; H01L 21/02101; H01L 21/67017; H01L 21/67028; H01L 21/67103; H01L 21/6719; H01L 21/67248; H01L 21/67051; H01L 21/67034; H01L 21/67109
USPC ........................................................ 134/95.1
See application file for complete search history.

(56) References Cited

U.S. PATENT DOCUMENTS

| | | | | |
|---|---|---|---|---|
| 2013/0000140 A1* | 1/2013 | Jung | .................. | H01L 21/67017 34/523 |
| 2013/0318815 A1* | 12/2013 | Kim | ...................... | B08B 7/0021 34/487 |
| 2015/0155158 A1* | 6/2015 | Kim | .................. | H01L 21/67017 34/82 |
| 2015/0352608 A1* | 12/2015 | Kim | .................... | H01L 21/6719 15/302 |
| 2016/0064259 A1* | 3/2016 | Kurusu | ............. | H01L 21/67028 134/99.1 |
| 2016/0334162 A1* | 11/2016 | Kim | .................. | H01L 21/67109 |
| 2017/0066101 A1* | 3/2017 | Yamaguchi | ....... | H01L 21/67046 |
| 2018/0158676 A1* | 6/2018 | Kiyohara | .......... | H01L 21/67017 |
| 2019/0131144 A1* | 5/2019 | Iwahata | .................... | B08B 3/14 |
| 2020/0290080 A1* | 9/2020 | Naitou | ................ | B05C 11/1005 |

FOREIGN PATENT DOCUMENTS

| | | |
|---|---|---|
| KR | 1020020093556 | 12/2002 |
| KR | 100934915 | 1/2010 |
| KR | 10-2013-0134996 | 12/2013 |
| KR | 101681190 | 12/2016 |
| WO | 2012013583 | 2/2012 |

* cited by examiner

SUBSTRATE TREATING APPARATUS AND SUBSTRATE TREATING METHOD

CROSS-REFERENCE TO RELATED APPLICATIONS

A claim for priority under 35 U.S.C. § 119 is made to Korean Patent Application No. 10-2020-0084279 filed on Jul. 8, 2020, in the Korean Intellectual Property Office, the entire contents of which are hereby incorporated by reference.

BACKGROUND

Embodiments of the inventive concept described herein relates to an apparatus and a method for treating a substrate, and more particularly, to an apparatus and a method for treating a substrate by using a supercritical fluid.

A semiconductor device is manufactured by using a substrate such a wafer. In detail, a semiconductor device is manufactured by performing a deposition process, a photographic process, a cleaning process, a drying process, an etching process, and the like to form a fine circuit pattern on an upper surface of a substrate.

The cleaning process includes a chemical treatment of removing foreign substances on a substrate by supplying a chemical to the substrate, a rinsing treatment of removing the chemical that resides on the substrate by supplying pure water to the substrate, and a drying treatment of removing the pure water that resides on the substrate.

A supercritical fluid is used to dry a substrate. According to an embodiment, an organic solvent left on the substrate is removed by replacing the pure water on the substrate by the organic solvent, supplying a supercritical fluid to an upper surface of the substrate in a high-pressure chamber, and dissolving the organic solvent in the supercritical fluid. When isopropyl alcohol (hereinafter, IPA) is used as the organic solvent, carbon dioxide ($CO_2$) that has a relatively low threshold temperature and a relatively low threshold pressure and in which the IPA is easily dissolved is used as the supercritical fluid.

The treatment of the substrate using the supercritical fluid is as follows. When the substrate is carried into the high-pressure chamber, carbon dioxide of a supercritical state is supplied into the high-pressure chamber to pressurize the interior of the high-pressure chamber, and then, the substrate is treated with the supercritical fluid while the supply of the supercritical fluid and the exhaustion of the high-pressure chamber are repeated. Furthermore, when the substrate is completely treated, the interior of the high-pressure chamber is exhausted and the pressure in the high-pressure chamber is reduced.

FIG. 1 illustrates a conventional substrate treating apparatus 5 using a supercritical fluid. Referring to FIG. 1, in a conventional drying process using a supercritical fluid, a fluid supply unit 56 supplies the supercritical fluid into a treatment space 50, in which a substrate "W" is positioned.

The fluid supply unit 56 has a main supply line 58, and an upper supply line 59 and a lower supply line 57 that are branched from the main supply line 58. The upper supply line 59 is connected to an upper chamber 52, and the lower supply line 57 is connected to a lower chamber 54.

After the supercritical fluid is supplied into the treatment space 50 through the upper supply line 59 or the lower supply line 57, the upper supply line 59 or the lower supply line 57 is emptied. Furthermore, if necessary, the supercritical fluid is supplied into the treatment space 50 through any one of the upper supply line 59 or the lower supply line 57 and the other is emptied. The supply line 57 and 59, to which the supercritical fluid of high temperature is not supplied, is naturally cooled.

Thereafter, when the supercritical fluid is supplied to the empty supply lines 57 and 59, the supercritical fluid is supplied into the treatment space through the cooled supply lines 57 and 59 while the temperature of the supercritical fluid does not reach a process temperature. Furthermore, particles are generated in a pipeline provided in the empty supply line 57 and 59, and are introduced into the treatment space 50.

SUMMARY

Embodiments of the inventive concept provide a substrate treating apparatus that adjusts a supercritical fluid to a proper process temperature and supplies the supercritical fluid when a substrate is treated by using a supercritical fluid, and a substrate treating method.

Embodiments of the inventive concept also provide a substrate treating apparatus that minimizes particles generated in a fluid supply unit when a substrate is treated by using a supercritical fluid, and a substrate treating method.

The aspect of the inventive concept is not limited thereto, and other unmentioned aspects of the inventive concept may be clearly appreciated by those skilled in the art from the following descriptions.

The inventive concept provides a substrate treating apparatus. The substrate treating apparatus includes a process chamber that provides a treatment space, in which a substrate is treated, in an interior thereof, a fluid supply unit that supplies a fluid into the process chamber, and an exhaust units including an exhaust line, through which the fluid in the process chamber is exhausted, the fluid supply unit includes a supply tank, in which the fluid is stored, a supply line connecting the supply tank and the process chamber, a branch line branched from the supply line at a first point of the supply line, and a controller that controls the fluid supply unit, and the controller controls the fluid supply unit such that the fluid is drained from the supply line through the branch line shortly before the fluid is supplied into the process chamber.

In an embodiment, the first point may be provided adjacent to the process chamber.

In an embodiment, the branch line may be connected to the exhaust line.

In an embodiment, the controller may control the fluid supply unit such that the fluid is drained through the branch line until the fluid in the supply line is brought into a stabilized state shortly before the fluid is supplied into the process chamber.

In an embodiment, the stabilized state may be a state, in which a temperature of the fluid around the first point reaches a process temperature, at which the substrate is treated in the process chamber.

In an embodiment, the stabilization state may be a state, in which particles of a preset amount or less are present around the first point.

In an embodiment, the fluid supply unit may include a first supply line connected to an upper portion of the process chamber, and a second supply line connected to a lower portion of the process chamber, and the branch line may be branched from the second supply line.

In an embodiment, the fluid supply unit may further include a first heater installed in the second supply line and that heats the fluid, and the branch line may be branched from the second supply line on a downstream side of the first heater.

In an embodiment, a second heater may be installed in the first supply line, and heating temperatures of the first heater and the second heater may be differently set.

In an embodiment, the fluid supply unit may further include a first valve installed in the second supply line between the first heater and the first point, an upper supply valve installed in the first supply line and that adjusts whether the fluid is supplied into the process chamber and a flow rate of the supplied fluid, a lower supply valve installed in the second supply line and that adjusts whether the fluid is supplied into the process chamber and a flow rate of the supplied fluid, a second valve installed in the branch line and that adjusts whether the fluid is drained from the supply line and an amount of the drained fluid, and an exhaust valve installed at the exhaust line and that adjusts whether the treatment space is exhausted and an exhaust rate of the treatment space being exhausted.

In an embodiment, the controller may control the lower supply valve such that the fluid is supplied into the process chamber through the second supply line until a pressure of the treatment space becomes a first pressure after the substrate is carried into the treatment space.

In an embodiment, the controller may control the first heater and the lower supply valve such that a temperature of the fluid supplied into the process chamber becomes a first temperature.

In an embodiment, the controller may control the first heater, the first valve, and the second valve such that the fluid in the second supply line is drained through the branch line until a temperature of the fluid around the first point becomes the first temperature before the fluid is supplied into the process chamber through the second supply line.

In an embodiment, the controller may control the first heater, the first valve, and the second valve such that the fluid in the second supply line is drained through the branch line until particles of a preset amount or less are present in the fluid around the first point before the fluid is supplied into the process chamber through the second supply line.

In an embodiment, the process chamber may be a high-pressure process chamber, in which a process is performed by using a supercritical fluid.

In an embodiment, a substrate treating apparatus may include a process chamber that provides a treatment space, in which a substrate is treated, in an interior thereof, a fluid supply unit that supplies a fluid into the process chamber, and an exhaust unit including an exhaust line, through which the fluid in the process chamber is exhausted, the fluid supply unit may include a supply tank, in which the fluid is stored, a first supply line connecting the supply tank and an upper portion of the process chamber, and in which an upper supply valve that adjusts whether the fluid is supplied into the process chamber and an amount of the supplied fluid is installed, a second supply line connecting the supply tank to a lower portion of the process chamber, the second supply line being provided with a lower supply valve that controls whether the fluid is supplied into the process chamber and adjusts an amount of the supplied fluid is installed, a branch line branched from a first point of the second supply line, the second supply line being connected to the exhaust line which is provided with a second valve, and a controller that controls the fluid supply unit, the second supply line may further include a first heater that heats the fluid, and a first valve installed between the first heater and the lower supply valve, the controller may control the fluid supply unit such that the fluid is drained from the second supply line through the branch line shortly before the fluid is supplied into the process chamber, and the first point may be provided adjacent to the process chamber between the first valve and the lower supply valve.

In an embodiment, the controller may control the lower supply valve, the first heater, the first valve, and the second valve such that the fluid in the second supply line is drained through the branch line until a temperature of the fluid around the first point becomes the first temperature before the fluid is supplied into the process chamber through the second supply line.

The inventive concept provides a method for treating a substrate with a supercritical fluid. The method includes draining a supply line, through which the supercritical fluid is supplied to a treatment space in a process chamber, pressurizing the treatment space to a first pressure by supplying the supercritical fluid to the treatment space after the draining of the supply line, and treating the substrate with the supercritical fluid in the treatment space.

In an embodiment, the supercritical fluid may be supplied at a first temperature in the pressurizing of the treatment space, and, in the draining of the supply line, the supply line may be drained until a temperature of the supercritical fluid in the supply line becomes the first temperature.

In an embodiment, the treatment of the substrate may be a treatment of drying the substrate, on which an organic solvent resides.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, embodiments of the inventive concept will be described in detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof.

Figure 1:
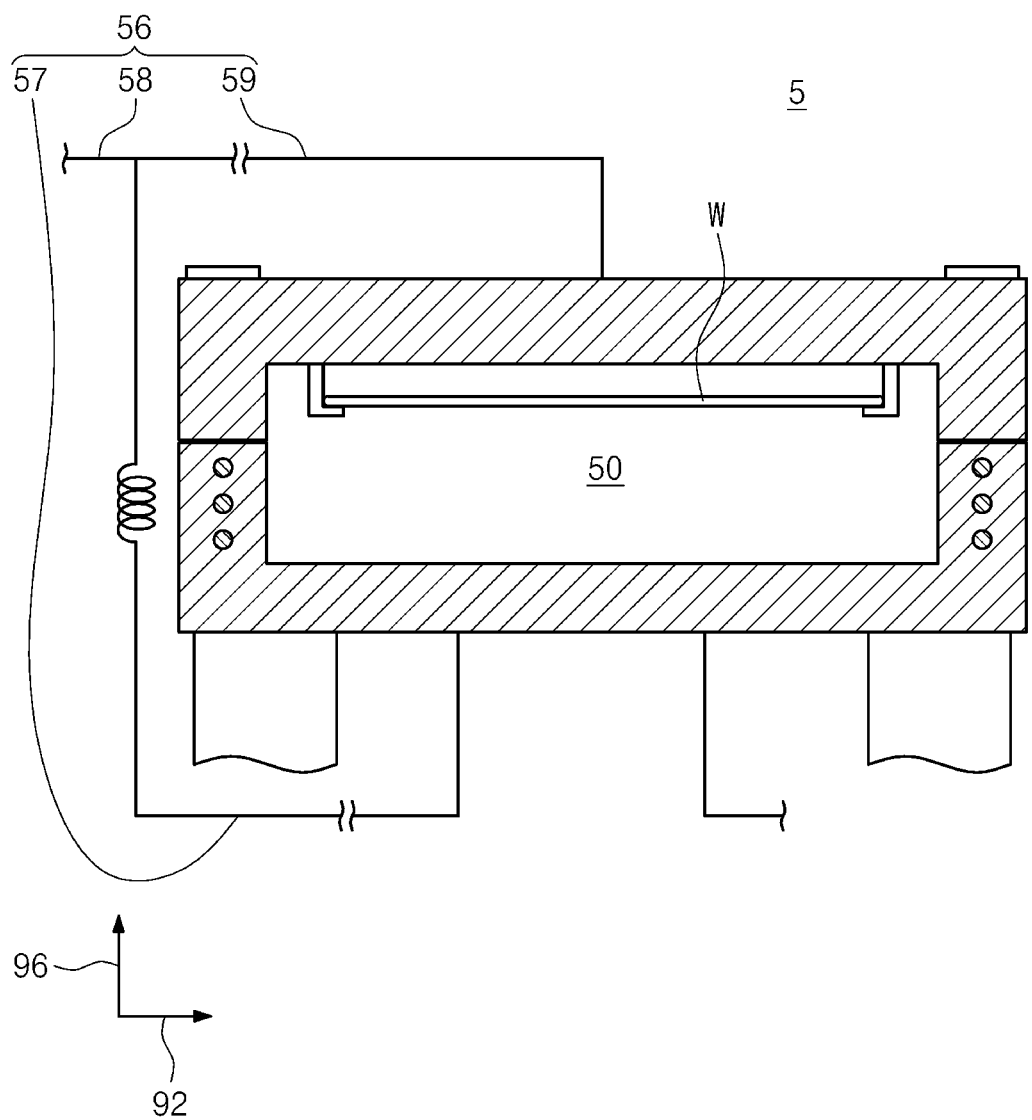
FIG. 1 is a cross-sectional view illustrating a general substrate treating apparatus.
Figure 2:
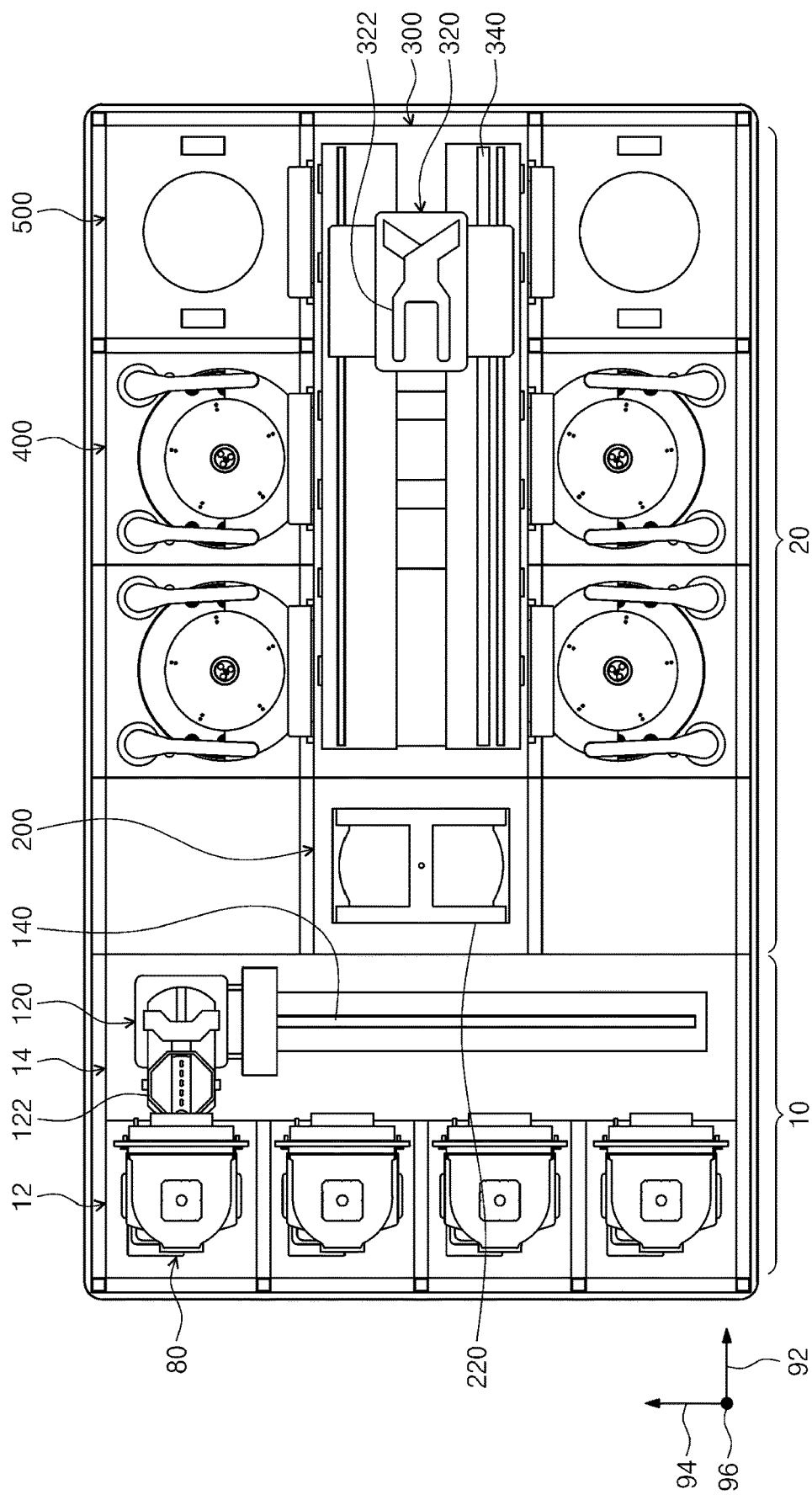
FIG. 2 is a plan view schematically illustrating a substrate treating apparatus according to an embodiment of the inventive concept.

FIG. 2 is a plan view schematically illustrating a substrate treating apparatus according to an embodiment of the inventive concept. Referring to FIG. 2, a substrate treating system includes an index module 10, a treatment module 20, and a controller (not illustrated). According to an embodiment, the index module 10 and the treatment module 20 are disposed along one direction. Hereinafter, a direction, in which the index module 10 and the treatment module 20 are disposed, will be referred to as a first direction 92, a direction that is perpendicular to the first direction 92 when viewed from the top will be referred to as a second direction 94, and a direction that is perpendicular to both the first direction 92 and the second direction 94 will be referred to as a third direction 96.

The index module 10 transfers a substrate "W" from a container 80, in which the substrate "W" is received, to the treatment module 20, and the substrate "W" completely treated by the treatment module 20 is received in the container 80. A lengthwise direction of the index module 10 is the second direction 94. The index module 10 includes a plurality of load ports 12 and an index frame 14. The load ports 12 are located on an opposite side of the treatment module 20 with respect to the index frame 14. The containers 80, in which the substrates "W" are received, are positioned on the load port 12. A plurality of load ports 12 may be provided, and the plurality of load ports 12 may be disposed along the second direction 94.

The container 80 may be a closed container such as a front open unified pod (FOUP). The container 80 may be positioned on the load port 12 by a feeding unit (not illustrated) such as an overhead transfer, an overhead conveyor, or an automatic guided vehicle, or an operator.

An index robot 120 is provided in the index frame 14. A guide rail 140, a lengthwise direction of which is the second direction 94, may be provided in the index frame 14, and the index robot 120 may be movable on the guide rail 140. The index robot 120 includes a hand 122, on which the substrate "W" is positioned, and the hand 122 may be moved forwards and rearward, be rotated about the third direction 96, and be moved along the third direction 96. A plurality of hands 122 may be provided to be spaced apart from each other in an upward/downward direction, and the hands 122 may be moved forwards and rearward independently.

The treatment module 20 includes a buffer unit 200, a transfer apparatus 300, a liquid treating apparatus 400, and a supercritical apparatus 500. The buffer unit 200 provides a space, in which the substrate "W" carried into the treatment module 20 and the substrate "W" carried out from the treatment module 20 temporarily stay. The liquid treating apparatus 400 performs a liquid treating process of liquid-treating the substrate "W" by supplying the liquid onto the substrate "W". The supercritical apparatus 500 performs a drying process of removing the liquid that resides on the substrate "W". The transfer apparatus 300 transfers the substrate "W" between any two of the buffer unit 200, the liquid treating apparatus 400, and the supercritical apparatus 500.

The transfer apparatus 300 is disposed such that the lengthwise direction thereof is the first direction 92. The buffer unit 200 is disposed between the index module 10 and the transfer apparatus 300. The liquid treating apparatus 400 and the supercritical apparatus 500 may be disposed on a side of the transfer apparatus 300. The liquid treating apparatus 400 and the transfer apparatus 300 may be disposed along the second direction 94. The supercritical apparatus 500 and the transfer apparatus 300 may be disposed along the second direction 94. The buffer unit 200 may be located at one end of the transfer apparatus 300.

According to an example, the liquid treating apparatus 400 may be disposed on opposite sides of the transfer apparatus 300, the supercritical apparatus 500 may be disposed on opposite sides of the transfer apparatus 300, and the liquid treating apparatus 400 may be disposed at locations that is closer to the buffer unit 200 that to the supercritical apparatus 500. On one side of the transfer apparatus 300, the liquid treating apparatus 400 may be provided on an array of A by B (A and B are integers that are 1 or more than 1) along the first direction 92 and the third direction 96. Further, on one side of the transfer apparatus 300, the supercritical apparatus 500 may be provided on an array of C by D (A and B are integers that are 1 or more than 1) along the first direction 92 and the third direction 96. Unlike the above description, only the liquid treating apparatus 400 may be provided on one side of the transfer apparatus 300, and only the supercritical apparatus 500 may be provided on an opposite side thereof.

The transfer apparatus 300 has a transfer robot 320. A guide rail 340, a lengthwise direction of which is the first direction 92, may be provided in the transfer apparatus 300, and the transfer robot 320 may be movable on the guide rail 340. The transfer robot 320 includes a hand 322, on which the substrate "W" is positioned, and the hand 322 may be moved forwards and rearward, be rotated about the third direction 96, and be moved along the third direction 96. A plurality of hands 322 may be provided to be spaced apart from each other in an upward/downward direction, and the hands 322 may be moved forwards and rearward independently.

The buffer unit 200 includes a plurality of buffers 220, on which the substrates "W" are positioned. The buffers 220 are disposed to be spaced apart from each other along the third direction 96. A front face and a rear face of the buffer unit 200 may be opened. The front face is a surface that faces the index module 10, and the rear face is a surface that faces the transfer apparatus 300. The index robot 120 may approach the buffer unit 200 through the front face, and the transfer robot 320 may approach the buffer unit 200 through the rear face.

Figure 3:
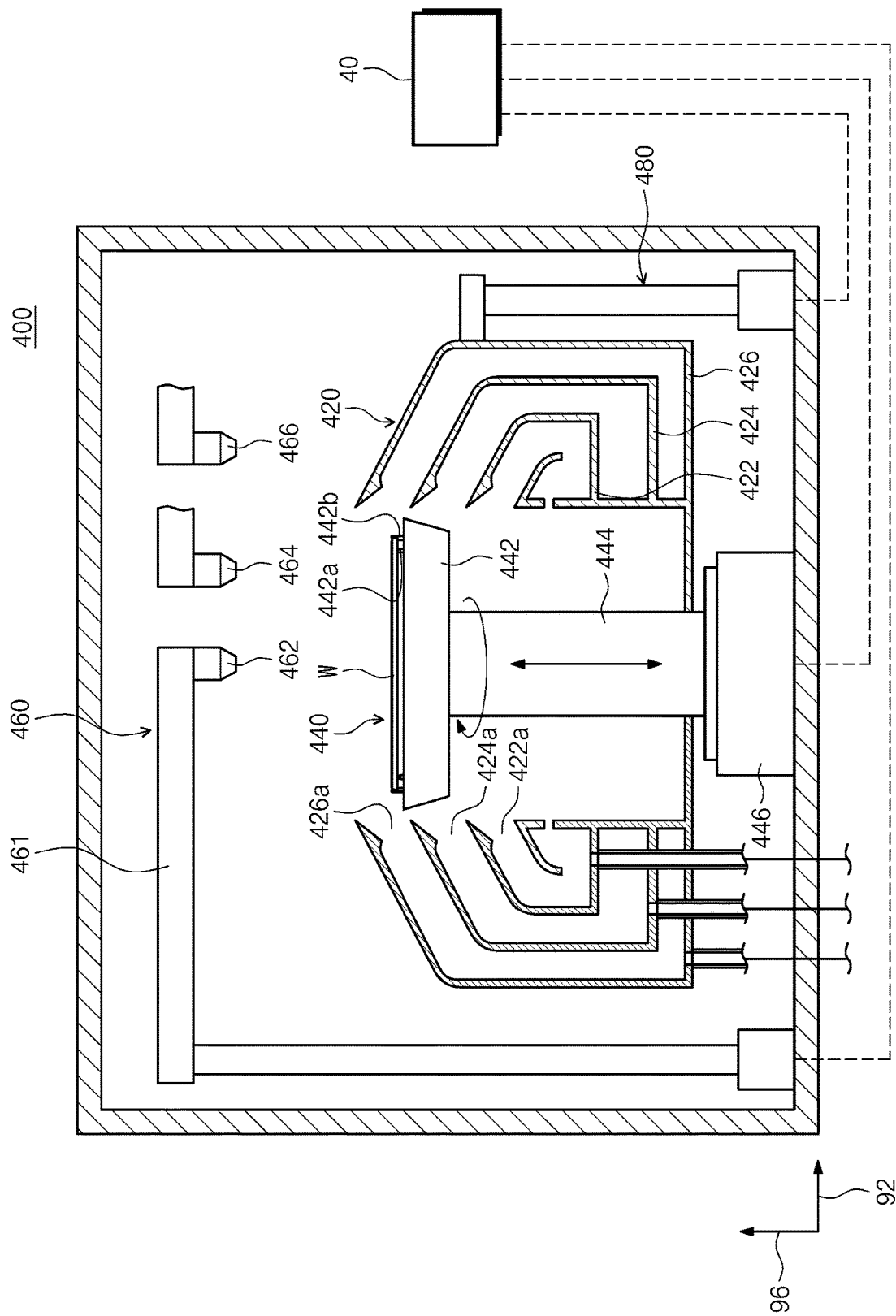
FIG. 3 is a view schematically illustrating an embodiment of a liquid treating apparatus of FIG. 2.

FIG. 3 is a view schematically illustrating an embodiment of a liquid treating apparatus 400 of FIG. 2. Referring to FIG. 3, the liquid treating apparatus 400 includes a housing 410, a cup 420, a support unit 440, a liquid supply unit 460, an elevation unit 480, and a controller 40. The controller 40 controls operations of the liquid supply unit 460, the support unit 440, and the elevation unit 480. The housing 410 has a substantially rectangular parallelepiped shape. The cup 420, the support unit 440, and the liquid supply unit 460 are disposed in the housing 410.

The cup 420 has a treatment space, an upper side of which is opened, and the substrate "W" is liquid-treated in the treatment space. The support unit 440 supports the substrate "W" in the treatment space. The liquid supply unit 460 supplies a liquid onto the substrate "W" supported by the support unit 440. A plurality of kinds of liquids may be provided, and may be sequentially supplied onto the substrate "W". The elevation unit 480 adjusts a relative height between the cup 420 and the support unit 440.

According to an embodiment, the cup 420 has a plurality of recovery vessels 422, 424, and 426. The recovery vessels 422, 424, and 426 have recovery spaces for recovering the liquid used for the treatment of the substrate. The recovery vessels 422, 424, and 426 are provided to have ring shapes that surround the support unit 440. When the liquid treatment process is performed, the pre-treatment liquid that spatters due to the rotation of the substrate "W" is introduced into the recovery spaces through inlets 422a, 424a, and 426a of the recovery vessels 422, 424, and 426. According to an embodiment, the cup 420 has a first recovery vessel 422, a second recovery vessel 424, and a third recovery vessel 426. The first recovery vessel 422 is disposed to surround the support unit 440, the second recovery vessel 424 is disposed to surround the first recovery vessel 422, and the third recovery vessel 426 is disposed to surround the second recovery vessel 424. The second inlet 424a, through which the liquid is introduced into the second recovery vessel 424, may be located on the upper side of the first inlet 422a, through which the liquid is introduced into the first recovery vessel 422, and the third inlet 426a, through which the liquid is introduced into the third recovery vessel 426, may be located on the upper side of the second inlet 424a.

The support unit 440 has a support plate 442 and a driving shaft 444. An upper surface of the support plate 442 may have a substantially circular shape, and may have a diameter that is larger than that of the substrate "W". A support pin 442a that supports a rear surface of the substrate "W" is provided at a central portion of the support plate 442, and an upper end of the support pin 442a protrudes from the support plate 442 such that the substrate "W" is spaced apart from the support plate 442 by a specific distance. A chuck pin 442b is provided at an edge portion of the support plate 442.

The chuck pin 442b protrudes upwards from the support plate 442, and supports a side of the substrate "W" such that the substrate "W" is not separated from the support unit 440 when the substrate "W" is rotated. The driving shaft 444 is driven by the driving member 446 and is connected to a center of a bottom surface of the substrate "W", and rotates the support plate 442 about a central axis thereof.

According to an example, the liquid supply unit 460 has a first nozzle 462, a second nozzle 464, and a third nozzle 466. The first nozzle 462 supplies a first liquid onto the substrate "W". The first liquid may be a liquid that removes films or foreign substances that reside on the substrate "W". The second nozzle 464 supplies a second liquid onto the substrate "W". The second liquid may be a liquid that is easily dissolved in a third liquid. For example, the second liquid may be a liquid that is dissolved in the third liquid easier than the first liquid. The second liquid may be a liquid that neutralizes the first liquid supplied onto the substrate "W". Furthermore, the second liquid may be a liquid that neutralizes the first liquid and is dissolved in the third liquid easier than the first liquid.

According to an embodiment, the second liquid may be water. The third nozzle 466 supplies the third liquid onto the substrate "W". The third liquid may be a liquid that is easily dissolved in a supercritical fluid used in the supercritical apparatus 500. For example, the third liquid may be a liquid that is dissolved in a supercritical fluid used in the supercritical apparatus 500 easier than the second liquid. According to an example, the third liquid may be an organic solvent. The organic solvent may be isopropyl alcohol (IPA). According to an embodiment, the supercritical fluid may be carbon dioxide.

The first nozzle 462, the second nozzle 464, and the third nozzle 466 may be supported by different arms 461, and the arms 461 may be moved independently. Optionally, the first nozzle 462, the second nozzle 464, and the third nozzle 466 may be mounted on the same arm to be moved at the same time.

The elevation unit 480 moves the cup 420 upwards and downwards. A relative height between the cup 420 and the substrate "W" is changed as the cup 420 is moved upwards and downwards. Accordingly, because the recovery vessels 422, 424, and 426 that recover the pre-treatment liquid are changed according to the kind of the liquid supplied to the substrate "W", the liquids may be separated and recovered. Unlike the above description, the cup 420 may be fixedly installed, and the elevation unit 480 may move the support unit 440 upwards and downwards.

Figure 4:
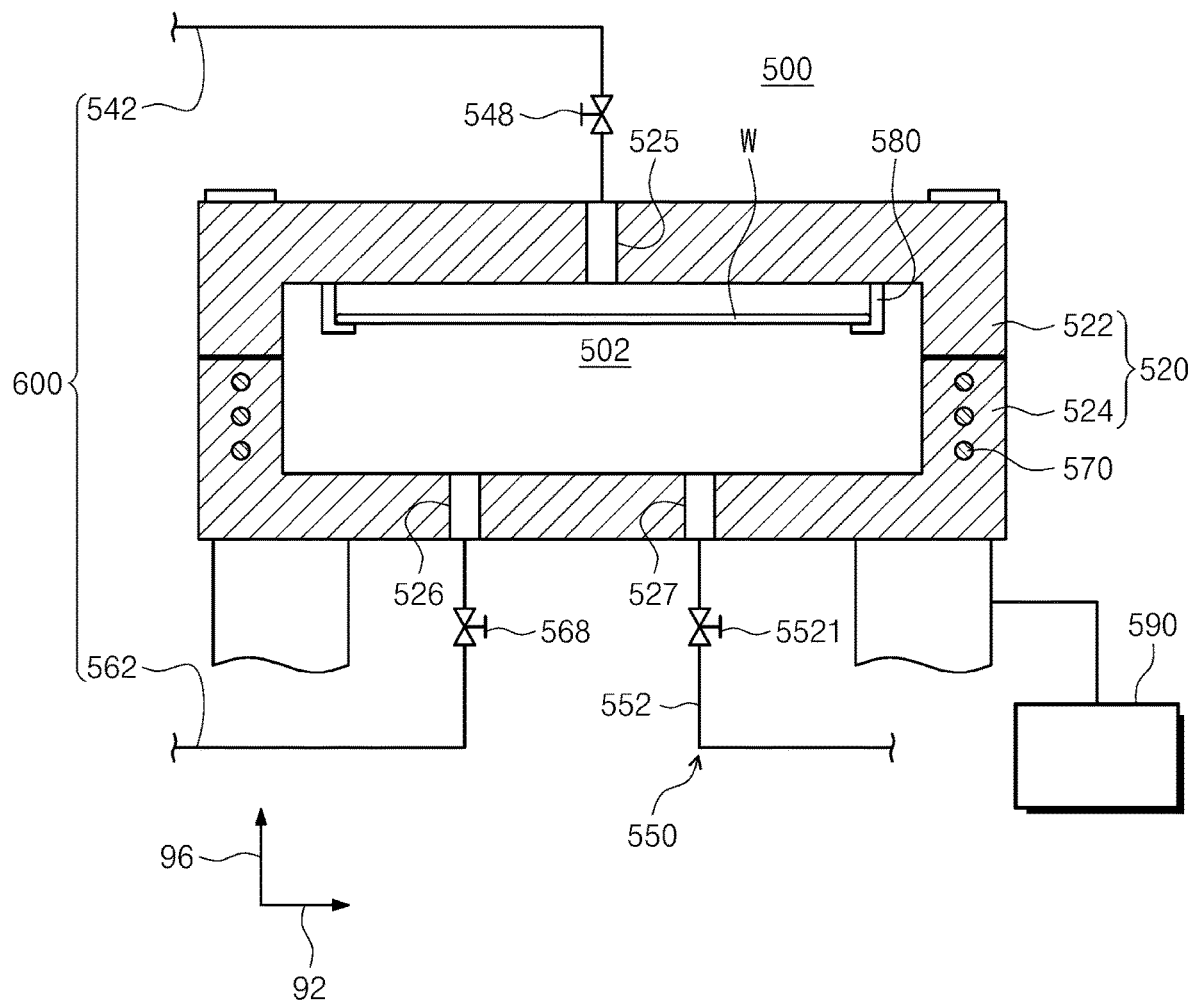
FIG. 4 is a view schematically illustrating an embodiment of a supercritical apparatus of FIG. 2.

FIG. 4 is a view schematically illustrating an embodiment of a supercritical apparatus 500 of FIG. 2. According to an embodiment, the supercritical apparatus 500 removes the liquid on the substrate "W" by using the supercritical fluid. According to an embodiment, the liquid on the substrate "W" is isopropyl alcohol (IPA). The supercritical apparatus 500 removes the IPA on the substrate "W" from the substrate "W" by supplying the supercritical fluid onto the substrate and dissolving the IPA in the supercritical fluid.

The supercritical apparatus 500 includes a process chamber 520, a fluid supply unit 600, a support unit 580, a driving member 590, and an exhaust unit 550.

The process chamber 520 provides a treatment space 502, in which the supercritical process is performed. The process chamber 520 has a first body 522 and a second body 524, and the first body 522 and the second body 524 are combined to provide the treatment space 502, which has been described above. In an embodiment, the first body 522 is provided on an upper side of the second body 524. The treatment space 502 is opened when the first body 522 is spaced apart from the second body 524, and then, the substrate "W" is carried in or out.

In an embodiment, the first body 522 may have a first discharge hole 525, to which the first supply line 542 is connected. The fluid may be supplied to the treatment space 502 through the first discharge hole 525. In an embodiment, the second body 524 may have a second discharge hole 526, to which the second supply line 562 is connected, and an exhaust hole 527, to which the exhaust line 552 is connected.

During the process, the first body 522 and the second body 524 are adhered to each other, and the treatment space 502 is closed from the outside. A heater 570 is provided in an interior of a wall of the process chamber 520. The heater 570 heats the treatment space 502 of the process chamber 520 such that the fluid supplied into the interior space of the process chamber 520 maintains the supercritical state. The interior of the treatment space 502 forms an atmosphere due to the supercritical fluid.

The support unit 580 supports the substrate "W" in the treatment space 502 of the process chamber 520. The substrate "W" carried into the treatment space 502 of the process chamber 520 is positioned on the support unit 580. According to an embodiment, the substrate "W" is supported by the support unit 580 such that a pattern surface thereof faces the upper side. In an example, the support unit 580 supports the substrate "W" on the upper side of the second discharge hole 526.

The driving member 590 elevates any one of the first body 522 and the second body 524 such that the process chamber 520 is moved to an opening location or a closing location. For example, the driving member 590 is a cylinder. Here, the opening location is a location, at which the first body 522 and the second body 524 are spaced apart from each other, and the closing location is a location, at which surfaces of the first body 522 and the second body 524 are adhered to each other. That is, the treatment space 502 is opened to the outside at the opening location, and the treatment space 502 is closed at the closing location. In an example, the driving member 590 raises or lowers any one of the first body 522 or the second body 524.

Further, an exhaust unit 550 is coupled to the second body 524. The supercritical fluid in the treatment space 502 of the process chamber 520 is discharged to the outside of the process chamber 520 through the exhaust unit 550. The exhaust unit 550 includes an exhaust line 552 and an exhaust valve 5521. The exhaust valve 5521 is installed in the exhaust line 552, and adjusts whether the treatment space 502 is exhausted and an amount of the exhaust.

Figure 5:
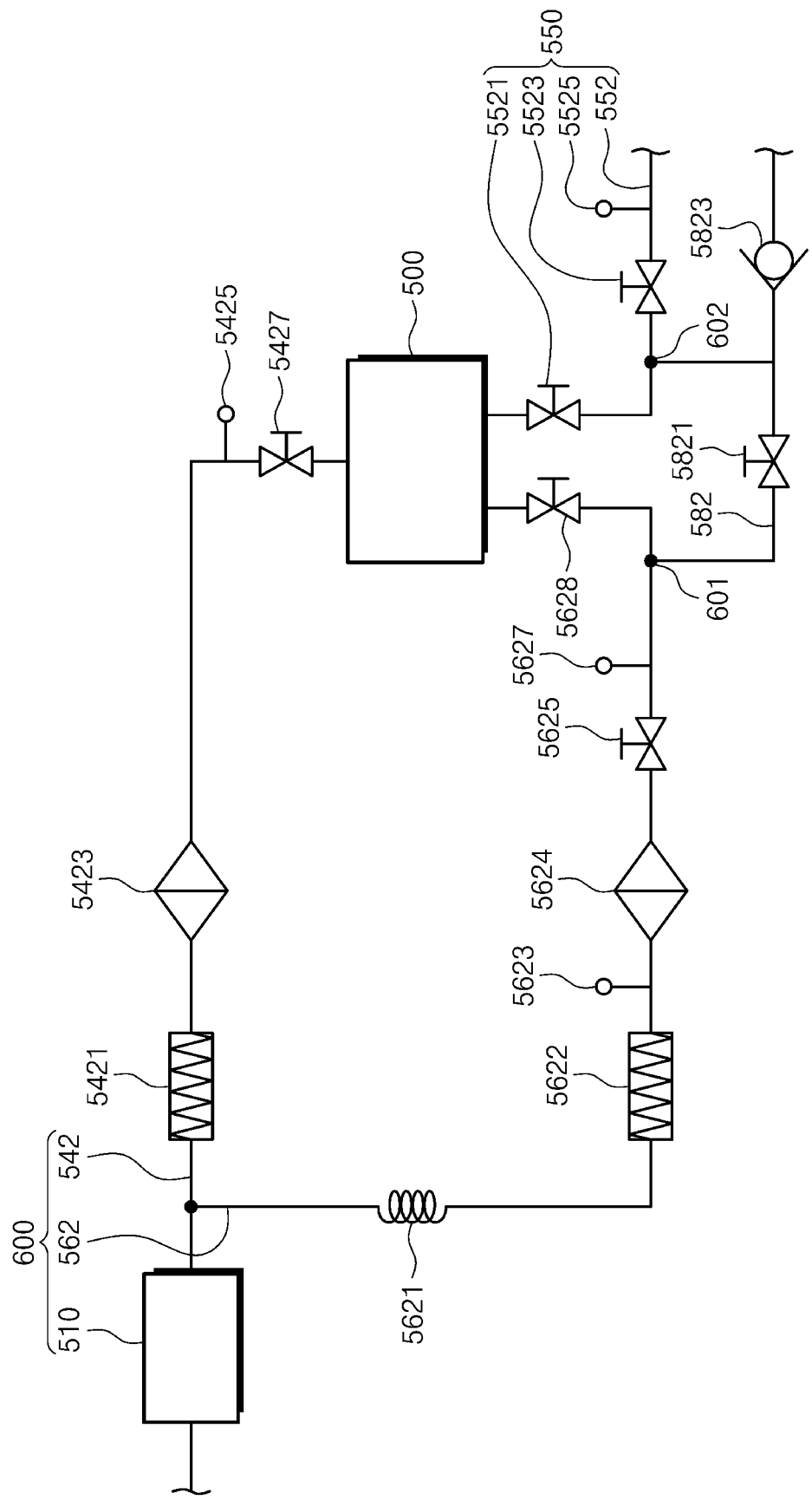
FIG. 5 is a view schematically illustrating a fluid supply unit according to an embodiment of the inventive concept.

The fluid supply unit 600 supplies the supercritical fluid for treating the substrate to the treatment space 502 of the process chamber 520. FIG. 5 is a view schematically illustrating a fluid supply unit 600 according to an embodiment of the inventive concept. Referring to FIG. 5, a fluid supply unit 600 has a supply tank 510, supply lines 542 and 562, and a branch line 582.

The supply tank 510 is connected to a fluid supply source (not illustrated) to receive carbon dioxide from the fluid supply source (not illustrated) and store the carbon dioxide. The supply lines 542 and 562 connect the supply tank 510 and the process chamber 520. The supply lines 542 and 562 have a first supply line 542 and a second supply line 562. In an example, the first supply line 542 is connected to an upper portion of the process chamber 520, and the second supply line 562 is connected to a lower portion of the process chamber 520. According to an embodiment, the first supply line 542 is coupled to an upper central portion of the second body 524, and the second supply line 562 is coupled to a lower central portion of the second body 524.

A second heater 5421, a first filter 5423, an upper supply valve 5427, and a first sensor 5425 are installed in the first supply line 542. The second heater 5421 heats carbon dioxide such that the fluid supplied from the supply tank 510 to the process chamber 520 is brought into a supercritical state. The first filter 5423 filters out particles in the interior of the fluid that passes through the second heater 5421. The upper supply valve 5427 adjusts whether the fluid is supplied from the supply tank 510 to the process chamber 520 and a flow rate of the supplied fluid. The first sensor 5425 measures whether the fluid supplied to the process chamber 520 reaches a temperature that is suitable for the supercritical treatment of the substrate.

In an example, the first supply line 542 and the second supply line 562 may be connected to each other by a flexible tube 5621. The flexible tube 5621 prevents the first supply line 542 and the second supply line 562 from being separated when the first body 522 or the second body 524 is elevated.

A first heater 5622, a second sensor 5623, a second filter 5624, a first valve 5625, a lower supply valve 5628, and a third sensor 5627 are installed in the second supply line 562. The first heater 5622 heats carbon dioxide such that the fluid supplied from the supply tank 510 to the process chamber 520 is brought into a supercritical state. The second sensor 5623 measures whether the fluid supplied to the first heater 5622 reaches a temperature that is suitable for the supercritical treatment of the substrate. The second filter 5624 filters out particles in the interior of the fluid that passes through the first heater 5622. The first valve 5625 is installed in the second supply line 562 between the first heater 5622 and a first point 601. The lower supply valve 5628 adjusts whether the fluid is supplied from the supply tank 510 to the process chamber 520 and a flow rate of the supplied fluid. A third sensor 5627 measures whether the fluid supplied to the process chamber 520 reaches a temperature that is suitable for the supercritical treatment of the substrate or an amount of the particles in the interior of the fluid supplied to the process chamber 520 is a preset amount or less.

The branch line 582 is branched from the supply lines 542 and 562 at the first point 601. In an embodiment, the branch line 582 is branched from the second supply line 562. The branch line 582 is branched from the second supply line 562 on a downstream side of the first heater 5622. Accordingly, the fluid that flows through the branch line 582 is the fluid heated by the first heater 5622. In an example, the branch line 582 is connected to the exhaust line 552 at a second point 602. Accordingly, the fluid drained through the branch line 582 may be discharged to the outside through the exhaust line 552. The first point 601 is provided to be adjacent to the process chamber 520 in the second supply line 562. Accordingly, the fluid heated by the first heater 5622 may be drained through the branch line 582 after heating a pipeline that is adjacent to the process chamber 520. The branch line 582 includes a second valve 5821 and a check valve 5823. The second valve 5821 adjusts whether the fluid is supplied on the branch line 582 and an amount of the supplied fluid. The check valve 5823 may allow the fluid in the branch line 582 to flow to the exhaust line 552 while flow reversely.

The exhaust line 552 further includes a first exhaust valve 5521, a second exhaust valve 5523, and an exhaust sensor 5525. The first exhaust valve 5521 adjusts whether the fluid is discharged from the treatment space 502 or an amount of the exhausted fluid. The second exhaust valve 5523 is provided on a downstream side of the second point 602 and adjusts whether the fluid in the exhaust line 552 or the branch line is drained. The exhaust sensor 5525 measures a flow rate or a temperature of the fluid exhausted from the treatment space 502.

Hereinafter, a substrate treating method according to an embodiment of the inventive concept will be described in detail with reference to FIGS. 6 to 11. The controller controls the substrate treating apparatus to perform the substrate treating method.

Hereinafter, a substrate drying method according to the inventive concept will be described by using the above-described supercritical apparatus 500. The following description relates to a substrate drying method of removing a residual liquid such as isopropyl alcohol, which is left after a cleaning process, by using a supercritical fluid. Meanwhile, because the above description is only for convenience of description, the substrate drying method may be performed by the same or similar apparatus, in addition to the aforementioned supercritical apparatus 500. Further, the substrate drying method according to the inventive concept may be stored in a computer readable recording medium in the form of a code or a program for performing the method.

Figure 6:
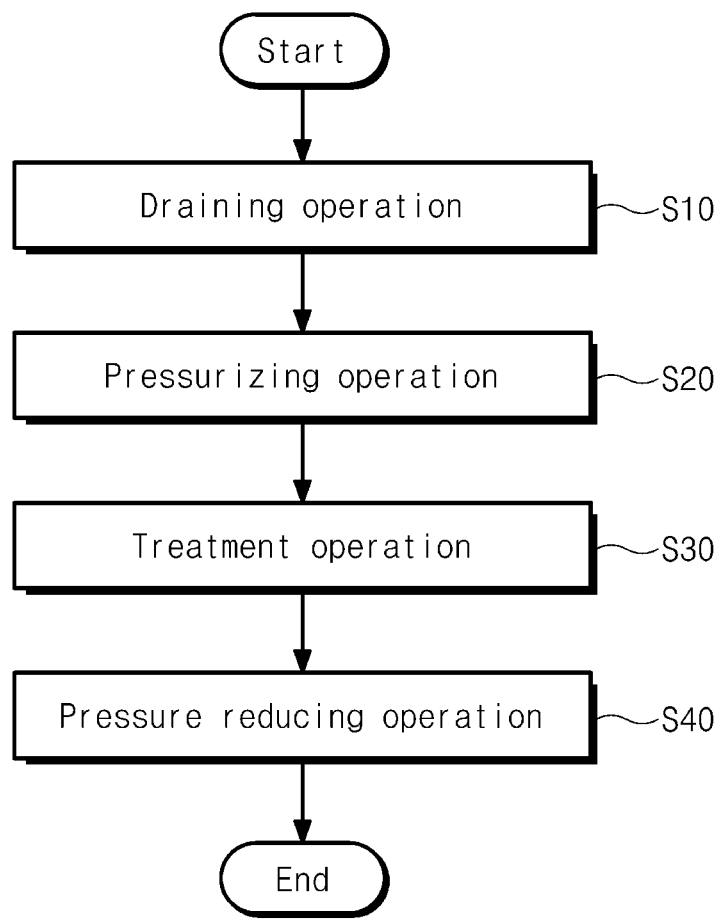
FIG. 6 is a flowchart of a substrate treating method according to an embodiment of the inventive concept.
Figure 7:
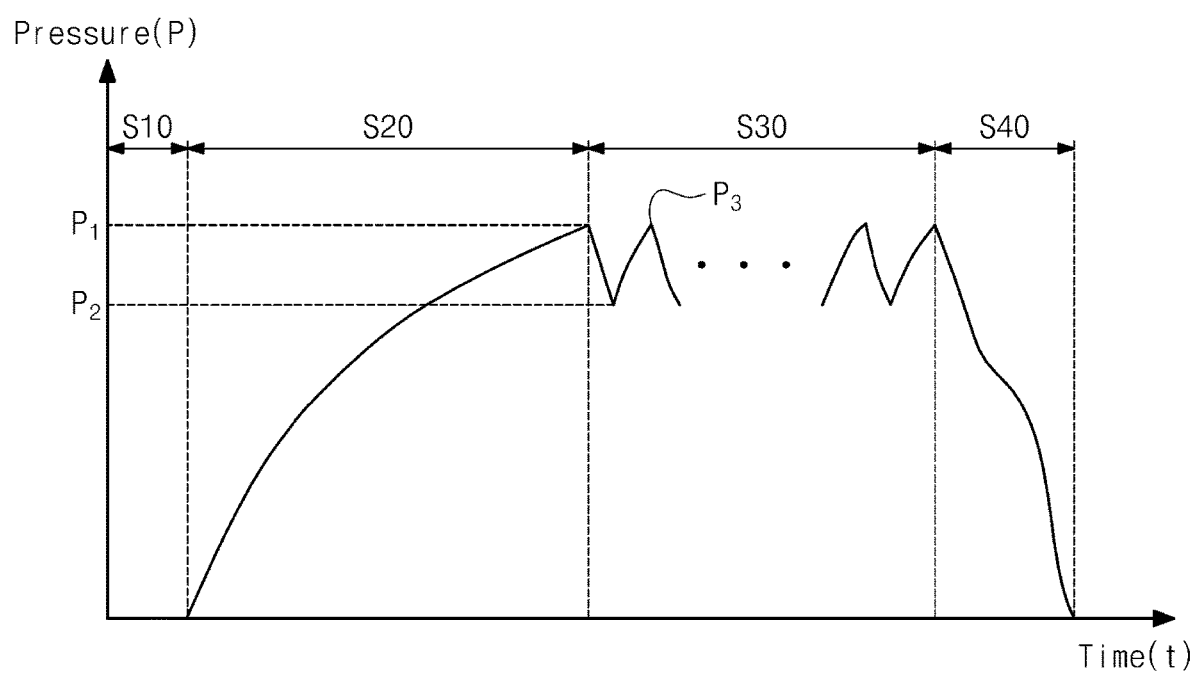
FIG. 7 is a graph illustrating a change in a pressure in an interior of a chamber according to time while the substrate treating method of the inventive concept is performed.

FIG. 6 is a flowchart of a substrate treating method according to an embodiment of the inventive concept. FIG. 7 is a graph illustrating a change in a pressure in an interior of a process chamber 520 according to time while the substrate treating method of the inventive concept is performed. FIGS. 8 to 11 are views sequentially illustrating a substrate treating method according to an embodiment of the inventive concept.

Referring to FIG. 6, a substrate treating method of the inventive concept includes a draining operation S10, a pressurizing operation S20, a treatment operation S30, and a pressure reducing operation S40.

Figure 8:
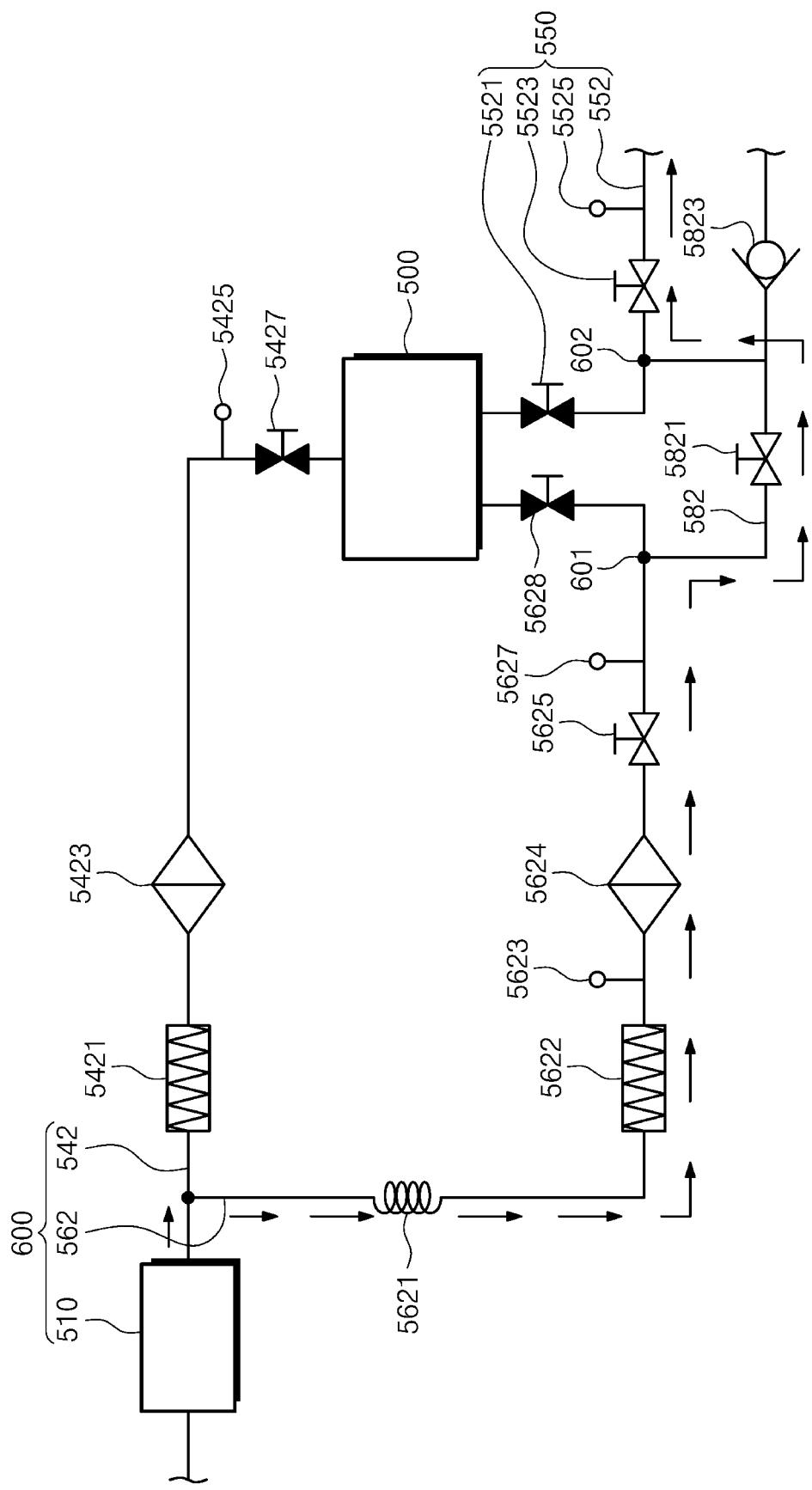
FIGS. 8 to 11 are views sequentially illustrating a substrate treating method according to an embodiment of the inventive concept.

Referring to FIG. 8, a dedicated substrate is treated before the draining operation S10, and the first supply line 542 and the second supply line 562 are emptied. Accordingly, the supply lines are naturally cooled. While the supply lines are naturally cooled, particles are generated in the interiors of the supply lines. Accordingly, when the fluid is supplied to the supply lines to treat a following substrate, the fluid is supplied to the treatment space 502 while not reaching a process temperature yet. Furthermore, the particles in the interiors of the supply lines are introduced into the treatment space 502. Accordingly, in the draining operation S10, the fluid in the supply lines is drained shortly before the fluid is supplied into the process chamber 520. In an example, as illustrated in FIG. 8, in the drain operation S10, the fluid in the second supply line 562 is drained through the branch line 582.

During the draining operation S10, the pipeline provided between the first heater 5622 and the first point 601 is heated while the fluid in the second supply line 562 is drained through the branch line 582. The draining operation S10 continues until the fluid around the first point 610 is brought into a stabilized state. In an example, the stabilized state is a state, in which a temperature of the fluid around the first point 601 reaches a process temperature for treating the substrate in the process chamber 520. Optionally, the stabilized state is a state, in which the particles of a preset amount or less is present in the fluid around the first point 601. Further, the stabilized state is a state, in which the temperature of the fluid around the first point 601 reaches the process temperature for treating the substrate in the process chamber 520 and the particles of the preset amount or less are prevent in the fluid around the first point 601. Accordingly, the fluid supplied to the treatment space 502 through the second supply line 562 is in a state, in which the fluid reaches the process temperature, and is in a state, in which the particles are removed.

While the draining operation S10 is performed, the substrate is carried into the treatment space 502. Optionally, before the draining operation S10 is performed, the substrate may be carried into the treatment space 502. In an example, in a state in which the first body 522 and the second body 524 are spaced apart from each other, the substrate "W", in which the IPA resides on an upper surface thereof, is carried into the treatment space 502. The substrate "W" is positioned on the support unit 580 such that a pattern surface thereof faces the upper side. When the substrate "W" is carried into the treatment space 502, the first body 522 and the second body 524 are adhered to each other to close the process chamber 520 as the first body 522 is lowered by the driving member 590. When the body 522 and the second body 524 are in the closing locations, the supercritical fluid is supplied into the treatment space 502 to pressurize the treatment space 502 in the pressurizing operation S20.

Figure 9:
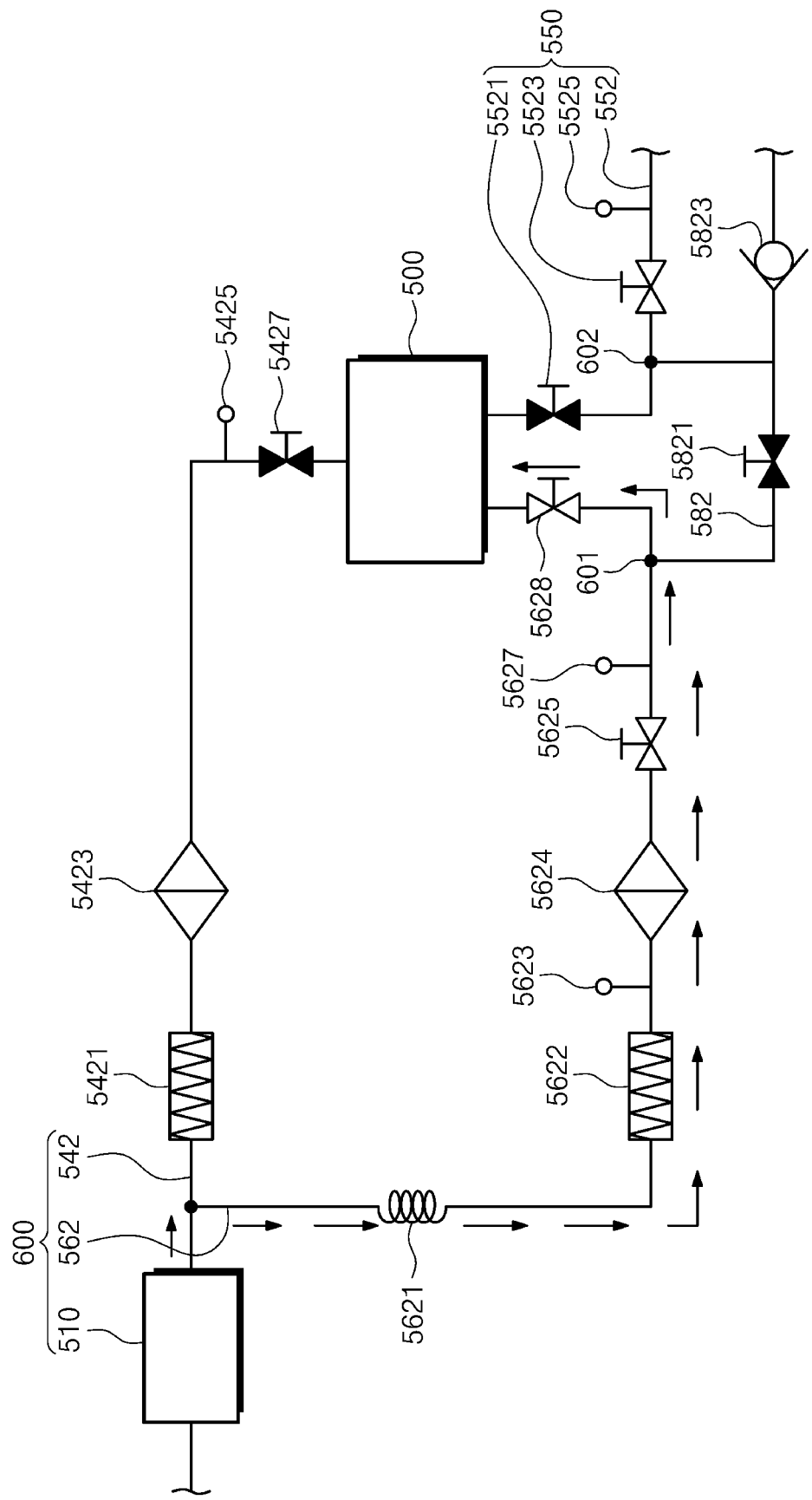

Referring to FIG. 9, in the pressurizing operation S20, the treatment space 502 is pressurized to a first pressure P1 that is a preset pressure by supplying carbon dioxide in the supercritical state into the treatment space 502. In an embodiment, in the pressurizing operation S20, the fluid is supplied into the process chamber 520 at a lower portion of the treatment space 502 through the second supply line 562. As the fluid supply unit 600 supplies the supercritical fluid to the bottom surface of the substrate "W" and the support unit 580 supports the substrate "W" on the upper side of the discharge hole, an impact applied to the pattern surface of the substrate "W" may be minimized in the process of supplying the fluid. In an embodiment, the temperature of the fluid supplied into the process chamber 520 may be set to be the same as the temperature of the fluid around the first point 601 in the draining operation S10.

Figure 10:
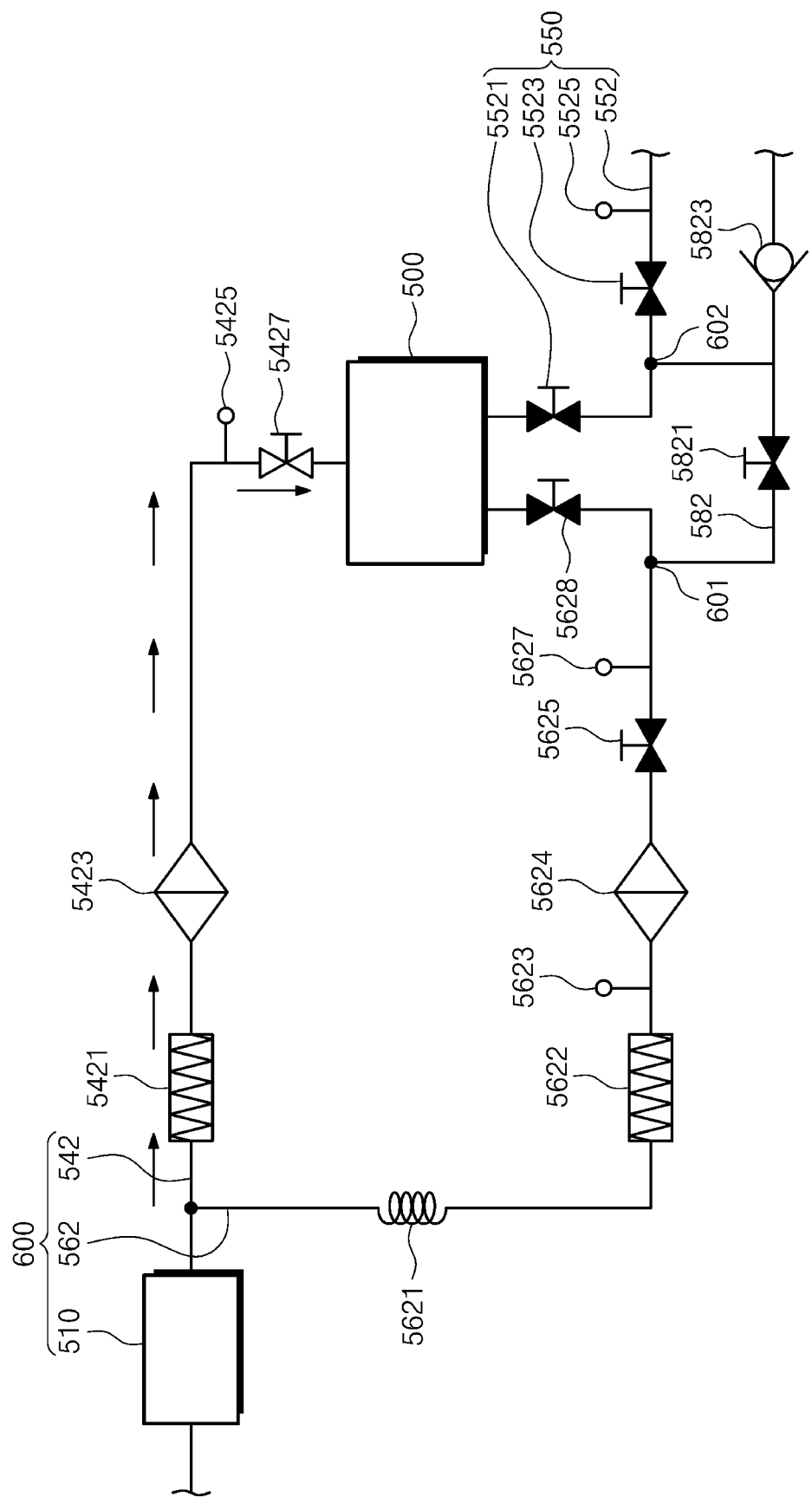

Thereafter, in the treatment operation S30, the substrate is dried with the supercritical fluid supplied into the treatment space 502. Referring to FIG. 10, in the treatment operation S30, the fluid is supplied into the process chamber 520 at an upper portion of the treatment space 502 through the first supply line 542. As the fluid is supplied at the lower portion of the treatment space 502 and then is supplied at the upper portion thereof, the supercritical fluid is easily mixed in the interior of the treatment space 502. A blocking plate for preventing the supercritical fluid from being directly supplied to the pattern surface of the substrate may be provided in the interior of the treatment space 502 to reduce a damage to the pattern of the substrate.

The treatment operation S30 includes a supply process and an exhaust process. In the supply process, the fluid is supplied into the interior of the process chamber 520 through the first supply line 542. In the exhaust process, the fluid in the treatment space 502 is exhausted through the exhaust line 552. The exhaust process is performed until a pressure of the treatment space 502 becomes a second pressure P2. The second pressure P2 is a pressure that is lower than the first pressure P1. The second pressure P2 is maintained at a pressure that is higher than a threshold pressure of carbon dioxide. The supply process is performed until a pressure of the treatment space 502 becomes a third pressure P3. The third pressure P3 is a pressure that is higher than the second pressure P2. In an embodiment, the third pressure P3 may be similar to the first pressure P1. In an embodiment, the temperature of the supercritical fluid supplied into the treatment space 502 in the supply process may be different from the temperature of the supercritical fluid supplied to the treatment space 502 in the pressing operation S20.

When the supply process is performed so that a specific amount of IPA is dissolved in the carbon dioxide in the supercritical state, the IPA is not dissolved in the carbon dioxide any more. Accordingly, the IPA is made to continue to be dissolved in the carbon dioxide by performing the exhaust process of exhausting the carbon dioxide, in which the specific amount of IPA is dissolved, from the treatment space 502 and performing the supply process of supplying the carbon dioxide in the new supercritical state into the treatment space 502. The exhaust process and the supply process described above are repeated.

Figure 11:
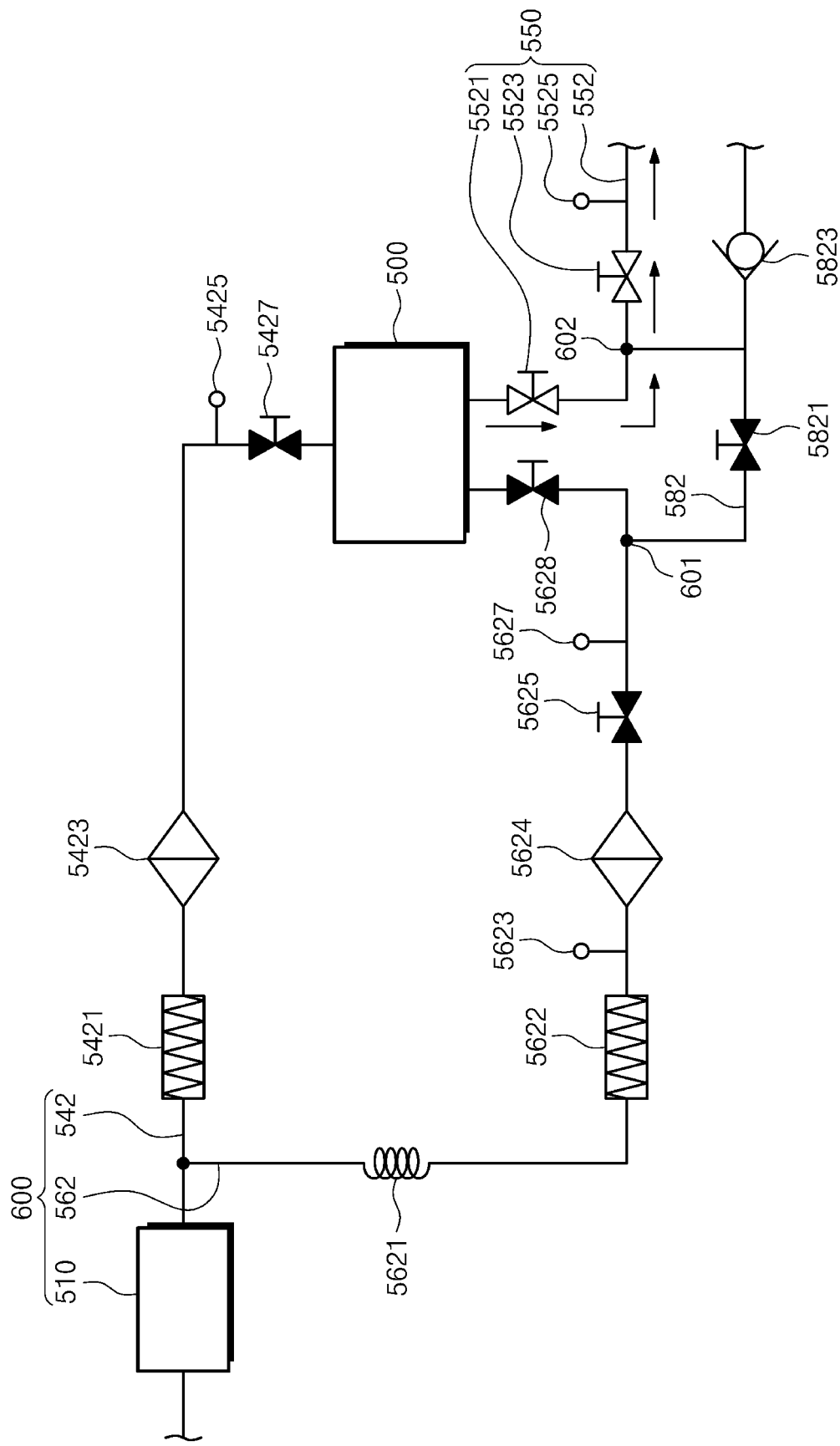

Referring to FIG. 11, in the pressure reducing operation S40, the treatment space 502 is exhausted after the substrate is completely treated. According to an embodiment, the pressure is reduced until the interior of the treatment space 502 becomes a normal pressure or a pressure that is similar to the normal pressure. When the pressure reducing operation S40 is completed, an opening operation of opening the process chamber 520 is performed, and when the process chamber 520 is opened, the substrate is carried out from the treatment space 502.

It has been described in the above example that the branch line 582 is branched from the second supply line 562. However, in another example, the branch line 582 may be branched from the first supply line 542 to perform the draining operation S10 before the treatment operation S30. Optionally, the branch line 582 may be provided to the first supply line 542 and the second supply line 562.

It has been described in the above-described example that the supercritical fluid is supplied to a lower portion of the substrate in the pressurizing operation S20 and is supplied to an upper portion of the substrate in the treatment operation S30. However, in both of the pressurizing operation S20 and the treatment operation S30, the supercritical fluid may be supplied to an upper portion of the substrate. Alternatively, in both of the pressurizing operation S20 and the treatment operation S30, the supercritical fluid may be supplied to a lower portion of the substrate. Alternatively, the supercritical fluid may be supplied to an upper portion of the substrate in the pressurizing operation S20 and is supplied to a lower portion of the substrate in the treatment operation S30

According to the inventive concept, the temperature of the fluid supplied into the treatment space 502 may be set by draining the supply line that supplies the supercritical fluid before the supercritical fluid is supplied into the treatment space 502. Accordingly, the uniformity of the temperature of the fluid may be improved and the reliability of the process may be increased during the process time.

Furthermore, according to the inventive concept, the particles in the interior of the fluid supplied into the treatment space 502 may be removed by draining the supply line that supplies the supercritical fluid before the supercritical fluid is supplied into the treatment space 502.

According to an embodiment of the inventive concept, a supercritical fluid may be adjusted to a proper process temperature and be supplied when a substrate is treated by using a supercritical fluid.

According to an embodiment of the inventive concept, particles generated in a fluid supply unit may be minimized when a substrate is treated by using a supercritical fluid.

The effects of the inventive concept are not limited to the above-mentioned effects, and the unmentioned effects can be clearly understood by those skilled in the art to which the inventive concept pertains from the specification and the accompanying drawings.

The above detailed description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the present invention in the disclosed embodiment state. Furthermore, it should be construed that the attached claims include other embodiments.

What is claimed is:

1. A substrate treating apparatus comprising:
   a process chamber configured to provide a treatment space, in which a substrate is treated, in an interior thereof;
   a fluid supply unit configured to supply a fluid into the process chamber;
   an exhaust unit including an exhaust line, through which the fluid in the process chamber is exhausted;
   wherein the fluid supply unit includes:
   a supply tank, in which the fluid is stored;
   a supply line connecting the supply tank and the process chamber;
   a branch line branched from the supply line at a first point of the supply line; and
   a sensor configured to measure a temperature of the fluid around the first point; and
   a controller configured to control the fluid supply unit, and
   wherein the controller controls the fluid supply unit such that the fluid is drained from the supply line through the branch line shortly before the fluid is supplied into the process chamber,
   wherein the controller controls the fluid supply unit such that the fluid is drained through the branch line until the fluid in the supply line reaches the a stabilized state shortly before the fluid is supplied into the process chamber, and
   wherein the stabilized state is a state, in which the temperature of the fluid around the first point reaches a process temperature, at which the substrate is treated in the process chamber.

2. The substrate treating apparatus of claim 1, wherein the first point is provided adjacent to the process chamber.

3. The substrate treating apparatus of claim 1, wherein the branch line is connected to the exhaust line.

4. The substrate treating apparatus of claim 3, wherein the fluid supply unit includes:
   a first supply line connected to an upper portion of the process chamber; and
   a second supply line connected to a lower portion of the process chamber, and
   wherein the branch line is branched from the second supply line.

5. The substrate treating apparatus of claim 4, wherein the fluid supply unit further includes:
   a first heater installed in the second supply line and configured to heat the fluid, and
   wherein the branch line is branched from the second supply line on a downstream side of the first heater.

6. The substrate treating apparatus of claim 5, wherein a second heater is installed in the first supply line, and heating temperatures of the first heater and the second heater are differently set.

7. The substrate treating apparatus of claim 5, wherein the fluid supply unit further includes:
   a first valve installed in the second supply line between the first heater and the first point;
   an upper supply valve installed in the first supply line and configured to adjust whether the fluid is supplied into the process chamber and a flow rate of the supplied fluid;
   a lower supply valve installed in the second supply line and configured to adjust whether the fluid is supplied into the process chamber and a flow rate of the supplied fluid;
   a second valve installed in the branch line and configured to adjust whether the fluid is drained from the supply line and an amount of the drained fluid; and
   an exhaust valve installed at the exhaust line and configured to adjust whether the treatment space is exhausted and an exhaust rate of the treatment space being exhausted.

8. The substrate treating apparatus of claim 7, wherein the controller controls the lower supply valve such that the fluid is supplied into the process chamber through the second supply line until a pressure of the treatment space becomes a first pressure after the substrate is carried into the treatment space.

9. The substrate treating apparatus of claim 8, wherein the controller controls the first heater and the lower supply valve such that a temperature of the fluid supplied into the process chamber becomes a first temperature.

10. The substrate treating apparatus of claim 9, wherein the controller controls the first heater, the first valve, and the second valve such that the fluid in the second supply line is drained through the branch line until a-the temperature of the fluid around the first point becomes the first temperature before the fluid is supplied into the process chamber through the second supply line.

11. The substrate treating apparatus of claim 1, wherein the process chamber is a high-pressure process chamber, in which a process is performed by using a supercritical fluid.

12. A substrate treating apparatus comprising:
a process chamber configured to provide a treatment space, in which a substrate is treated, in an interior thereof;
a fluid supply unit configured to supply a fluid into the process chamber; and
an exhaust unit including an exhaust line, through which the fluid in the process chamber is exhausted,
wherein the fluid supply unit includes:
a supply tank, in which the fluid is stored;
a first supply line connecting the supply tank and an upper portion of the process chamber, and in which an upper supply valve that adjusts whether the fluid is supplied into the process chamber and an amount of the supplied fluid is installed;
a second supply line connecting the supply tank to a lower portion of the process chamber, wherein the second supply line is provided with a lower supply valve that controls whether the fluid is supplied into the process chamber and adjusts an amount of the supplied fluid is installed;
a branch line branched from a first point of the second supply line, wherein the second supply line is connected to the branch line which is provided with a second valve, and wherein the exhaust line is further connected to the branch line;
a controller configured to control the fluid supply unit; and
a sensor configured to measure a temperature of the fluid around the first point,
wherein the second supply line further includes:
a first heater configured to heat the fluid; and
a first valve installed between the first heater and the lower supply valve,
wherein the controller controls the fluid supply unit such that the fluid is drained from the second supply line through the branch line shortly before the fluid is supplied into the process chamber,
wherein the controller controls the lower supply valve, the first heater, the first valve, and the second valve such that the fluid in the second supply line is drained through the branch line until the temperature of the fluid around the first point becomes a first temperature before the fluid is supplied into the process chamber through the second supply line, and
wherein the first point is provided adjacent to the process chamber between the first valve and the lower supply valve.

* * * * *